CURRENT MODE EXCLUSIVE-OR INVERT CIRCUIT

Filed Aug. 22, 1967

| | | JUNCTION 100 | JUNCTION 101 | OUTPUT |
|---|---|---|---|---|
| SIGNAL IN | A'B | − | − | − |
| | A B' | − | − | − |
| | A B | − | + | + |
| | A'B' | + | − | + |

INVENTOR.
MICHAEL T. LARRIVA

BY John L. Jackson
Attorney

United States Patent Office 3,519,845
Patented July 7, 1970

3,519,845
CURRENT MODE EXCLUSIVE-OR INVERT CIRCUIT

Michael T. Larriva, Phoenix, Ariz., assignor to International Business Machines Corporation, Armonk, N.Y., a corporation of New York Filed Aug. 22, 1967, Ser. No. 662,514
Int. Cl. H03k 19/32
U.S. Cl. 307—216 6 Claims

ABSTRACT OF THE DISCLOSURE

A current mode exclusive-OR circuit having two current switch inputs each connected to a voltage clamp to prevent saturation and each connected to an emitter follower for level setting and output current. The collectors of the clamping transistors and emitter followers are tied together at a common collector point, and the complement to the exclusive-OR function is obtained from a pair of input signals.

BACKGROUND OF THE INVENTION

Field of the invention

This invention relates to monolithic integrated semiconductor logical circuits in general and, more particularly, to a circuit for semiconductor devices providing the complement to the exclusive-OR function from a pair of input signals.

Description of the prior art

Various implementations of exclusive-OR complementary circuits in the past have required a relatively large number of isolation areas due to the lack of common collector junctions. One prior art circuit utilized to accomplish the exclusive-OR function, which is currently commercially available, requires eight isolation areas in a silicon type of semiconductor device. As is we know, in order to provide an isolation area in a silicon type of semiconductor device a discrete amount of silicon must be allowed to remain between the collector areas, which, in turn, results in a large amount of the area on the chip being required for a given circuit. Obviously, then, the fewer the isolation areas in a given circuit the greater the number of circuits which can be provided on a single chip. This, in turn, is related to expense since the cost per chip is the same, whether the chip has 1 or 100 circuits on it because to produce a chip with one circuit necessitates the same number of steps as a chip containing 100 circuits.

Additionally, prior art exclusive-OR complementary circuits have heretofore either required four input signals or more logic stages. Thus, two input signals and their complements have been required. In those systems wherein only the presence of signals is provided at the input stage to the exclusive-OR circuit, a complementary or inverter circuit was required.

Furthermore, most prior art exclusive-OR complementary circuits are of the saturation type and are therefore frequency-limited due to transistor storage time. Not only is the frequency limitation a problem with saturated logic, but also saturated logic is quite susceptible to state-changing transients which are produced whenever a transistor is driven from cutoff to saturation or vice versa. These transients produce current and voltage spikes which propagate down a line and produce crosstalk and other forms of noise which can result in spurious or false triggering of succeeding stages. Consequently, to alleviate this problem saturated logic requires relatively high logic levels which, since circuit speed is a function of loic level, further decrease the available speed from saturated logic.

SUMMARY

Briefly, there is provided an exclusive-OR complementary circuit or "equals" circuit of the current mode logic type. The inputs to the circuit are each applied to the base of a transistor which has an associated transistor connected in a current switch configuration such that one of the pair is on when the other is off. The collectors of the input transistors are tied together, and the collectors of the complementary current switch transistors are likewise tied together.

These pairs of transistors are prevented from entering saturation by a voltage clamping transistor and have their outputs each applied to an emitter follower. The output from the circuit is taken from the emitter followers.

Only two logic circuits are required since the current switch configuration is used which will produce complementary signals to the input signals. The circuit takes advantage of each of the logical functions presented at all points in the circuit to provide the complement to the exclusive-OR function with a minimum number of components.

DESCRIPTION OF THE PREFERRED EMBODIMENT

Figures 1, 2:
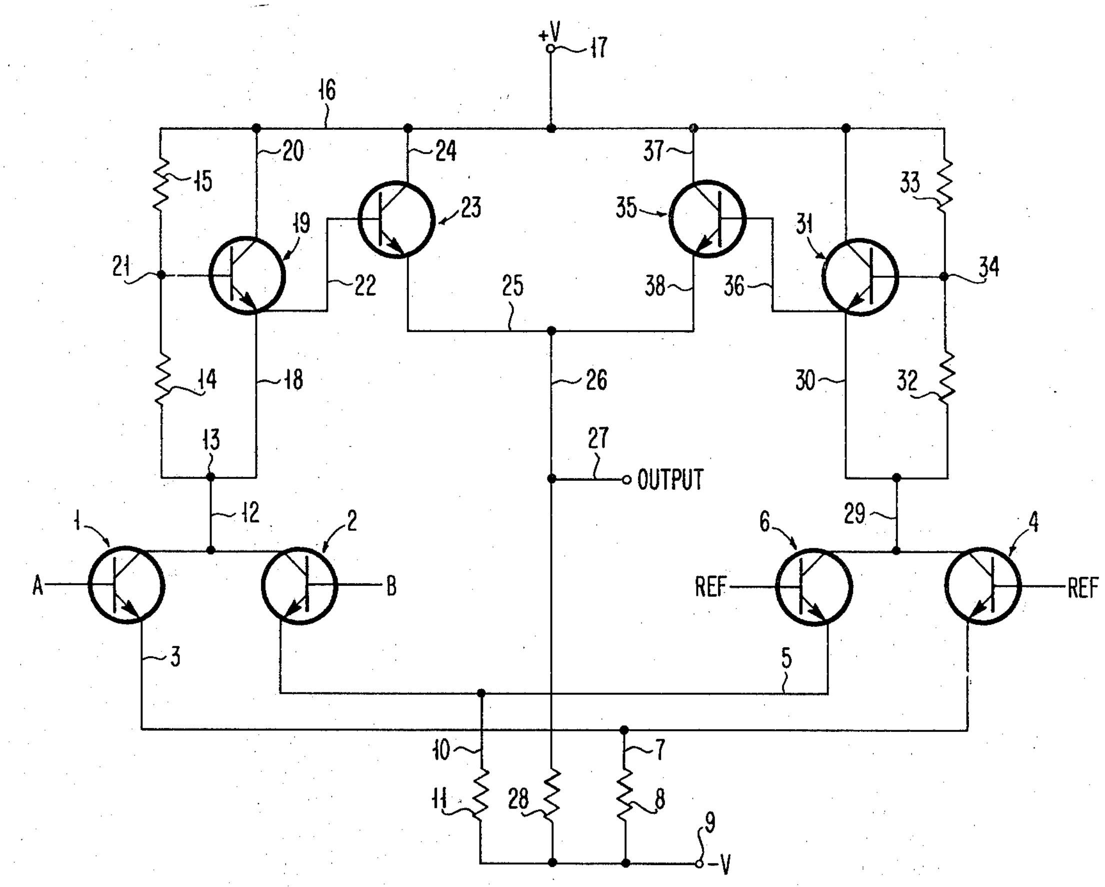
FIG. 1 is a schematic of the hereindescribed novel exclusive-OR complementary circuit.
FIG. 2 is a truth table illustrating the values of the logic levels appearing at various points in the circuit associated with the varying inputs.

In FIG. 1 there is shown a schematic of the novel exclusive-OR complementary circuit which is also known as an "equals" circuit. As shown in FIG. 1, the inputs A and B are applied to the bases of the input transistors generally designated as 1 and 2. Transistor 1 is connected along line 3 to the emitter of a transistor generally designated as 4. The emitter of transistor 2 is connected along line 5 to the emitter of a transistor generally designated as 6. Line 3 is connected along line 7 through resistor 8 to a negative potential applied to terminal 9. Line 5 is connected along line 10 through resistor 11 to the negative potential applied to terminal 9.

The bases of transistors 4 and 6 are connected to a reference potential which biases them off in the event that their associated transistors 1 and 2 respectively are on. Thus, if transistor 1 is on, transistor 4 will be off, and if transistor 2 is on, transistor 6 will be off, and vice versa. The collectors of transistors 1 and 2 are tied together and are applied along line 12 to a junction 13. The junction 13 is connected through voltage dividing resistors 14 and 15 to line 16 which, in turn, is connected to terminal 17 which has a positive potential applied to it. Junction 13 is also connected along line 18 to the emitter of a transistor generally designated as 19 which has its collector connected along line 20 to line 16 and the positive potential. The base of transistor 19 is connected to junction 21 between the voltage dividing resistors 14 and 15. Transistor 19 and resistor 14 and 15 comprise a well known voltage clamp which, when appropriate levels are provided, will prevent transistors 1 and 2 from entering saturation.

The emitter of transistor 19 is connected along line 22 to the base of an emitter follower transistor 23 which has its collector connected along line 24 to the positive potential. The output of the emitter follower transistor 23 is taken from the emitter and applied along lines 25, 26 and 27 to the output terminal. Line 26 is also connected through resistor 28 to the negative potential applied to terminal 9.

The right-hand side of the circuit is identical to the previously described left-hand side to provide a symmetrical circuit. Thus, the collectors of transistors 4 and 6 are tied along lines 29 and 30 to the emitter of a transistor generally designated as 31 and are connected through voltage dividing resistors 32 and 33 along line 16 to the positive potential. Again, the base of transistor 31 is connected to junction 34 between the voltage dividing resistors 32 and 33. The emitter of transistor 31 is connected to an emitter follower transistor generally designated as 35 along line 36. The collector of the emitter follower transistor 35 is connected along line 37 to the positive potential, and its emitter is connected along lines 38, 26 and 27 to the output terminal.

In the following operation description, refer both to the circuit of FIG. 1 and the truth table of FIG. 2. When a potential is applied to the base of transistor 1 which is more negative than the reference potential applied to the base of transistor 4, transistor 1 will be turned off and transistor 4 will be turned on. Likewise, when a potential is applied to the base of transistor 2 which is more negative than the reference potential applied to the base of transistor 6, transistor 2 will be turned off and transistor 6 will be turned on. When both transistor 1 and transistor 2 are off, a positive potential approaching the positive level applied to terminal 17 will appear on the collector of transistors 1 and 2 and on line 12. Line 12 will be held positive by the positive potential applied to terminal 17 through resistors 14 and 15. This positive level will be applied along lines 12, 18 and 22 to the base of the emitter follower transistor 23 causing the emitter of transistor 23 to be positive. The positive potential on the emitter of transistor 23 will be applied along lines 25 and 26 causing the output to be at its most positive level.

At the same time, since transistor 4 and transistor 6 are on, the collector of transistors 4 and 6 and line 29 will be drawn toward the negative potential and would normally cause transistors 4 and 6 to enter saturation. However, transistor 31 and resistors 32 and 33 form a voltage clamping circuit which, when appropriate values are chosen, will prevent transistors 4 and 6 from entering saturation and slowing down circuit recovery. The collector potential from transistors 4 and 6 will be applied along lines 29, 30 and 36 to the base of emitter follower transistor 35 and, since the potential from the output applied along lines 26 and 38 to the emitter of transistor 35 is high, transistor 35 will be turned off.

If the input signals A and B are more positive than the reference potential, transistors 1 and 2 will be on and transistors 4 and 6 will be off. Since both transistors 4 and 6 are off, a positive potential approaching the positive level applied to terminal 17 will appear on the collector of transistors 4 and 6 and line 29. Line 29 will be held positive by the positive level applied to terminal 17 through resistors 32 and 33. This positive potential is applied along lines 30 and 36 to the base of transistor 35 causing the emitter of transistor 35, lines 38 and 26 and hence the output, to be at its most positive level. Since transistors 1 and 2 are on, the collector of transistors 1 and 2, lines 12, 18 and 22 will be held out of saturation by the voltage clamping circuit comprised of transistor 19 and resistors 14 and 15 and emitter follower transistor 23 will be turned off due to the positive output level applied through lines 25 and 26. Thus, a positive logic level will appear at the output if A and B are both high or both low.

If transistor 1 is turned on by the applied of a positive logic level A to its base, its associated current switch transistor 4 will be turned off as previously described. Application of a negative logic level B to the base of transistor 2 will cause transistor 2 to turn off and its associated current switch transistor 6 to turn on. Therefore, if transistor 1 is on and transistor 2 is off, line 12 will be drawn toward the negative potential and the base of transistor 23 will drop. Since transistor 1 is on and transistor 2 is off, transistor 4 is off and transistor 6 is on and line 29 will be drawn toward the negative potential and the base of transistor 35 will drop. Since bases of both emitter follower transistors 23 and 35 are low, the output will be at its lowest level. The same is true when transistor 1 is off due to a negative logic level A and transistor 2 is on due to a positive logic level B. Thus, a negative logic level will appear at the output if A is positive and B is negative or if A is negative and B is positive. Thus, the function of the complement to the exclusive-OR circuit ($AB+A'B'$) is provided.

It will be appreciated by those skilled in the art that the subject novel circuit not only accomplishes the complement to the exclusive-OR function with a minimum number of components but accomplishes this function in the current mode logic form. Thus, voltage clamping transistors 19 and 31 prevent transistors 1, 2 and 4, 6 respectively from entering saturation which, as previously described, provides a high-speed system which is relatively insensitive to noise transients. Likewise, from consideration of the above description the complement to the exclusive-OR function is provided from two signals A and B without the requirement that inputs A′ and B′ be provided.

While the invention has been particularly shown and described with reference to a preferred embodiment thereof, it will be understood by those skilled in the art that various changes in the form and details may be made therein without departing from the spirit and scope of the invention.

What is claimed is:

1. A logical arrangement for producing bistatic output levels about a point of reference potential in response to two bistatic input signals, comprising
   two input terminals between which and said point of reference potential said bistatic input signals are individually applied,
   an output terminal between which and said point of reference potential said bistatic output levels appear,
   four transistors having collector electrodes connected in pairs and emitter electrodes connected in different pairs with base electrodes of two transistors connected individually to said input terminals and the remaining base electrodes connected to said point of reference potential,
   resistance means connected between said output terminal and between said emitter electrodes and a terminal to which is applied energizing potential negative with respect to said point of reference potential,
   two transistor devices having base electrode elements individually connected to said interconnected collector electrode pairs of said four transistors, collector electrode elements connected to a terminal to which is applied an energizing potential positive with respect to said point of reference potential, and
   emitter electrode elements connected to said output terminal.

2. A logical circuit arrangement as defined in claim 1 and incorporating
   semiconductor devices individually connected between the base electrode elements and the collector electrode elements of said transistor devices.

3. A logical circuit arrangement as defined in claim 1 and incorporating transistor structures having
   collector electrode elements connected to said terminal of positive energizing potential,
   emitter electrode elements individually connected to said base electrode elements of said two transistor devices, and
   base electrode elements,
   resistive elements interconnecting the base and emitter electrode elements of each of said transistor structures, and resistance elements connected between said base electrode elements of said structures and said terminal of positive energizing potential.

4. The invention as defined in claim 3 and wherein said collector electrode elements and one terminal of each of said resistive elements are connected together at a common circuit point.

5. The invention as defined in claim 1 and wherein said transistors and said transistor devices are all of the same type.

6. The invention as defined in claim 3 and wherein said transistor structures are of the same type as said transistors and said transistor device.

References Cited

UNITED STATES PATENTS

| | | | |
|---|---|---|---|
| 3,003,071 | 10/1961 | Henle | 307—216 |
| 3,094,632 | 6/1963 | Wartella | 307—216 |

OTHER REFERENCES

IBM Technical Disclosure Bulletin titled "Inverse Exclusive-OR Circuit" by Jen, dated January 1966, vol. 8, No. 8, pp. 1156 & 1157.

IBM Technical Disclosure Bulletin titled "Exclusive-OR Complement Circuit" by Evans, dated February 1967. vol. 9, No. 9, pp. 1210 and 1211.

STANLEY T. KRAWCZEWICZ, Examiner

U.S. Cl. X.R.

307—214, 216